United States Patent [19]
Miller et al.

[11] Patent Number: 5,247,259
[45] Date of Patent: Sep. 21, 1993

[54] CABLE TESTING METHOD AND APPARATUS

[75] Inventors: Matthew T. Miller, HArrisburg; Thomas J. Ryan, Annville, both of Pa.

[73] Assignee: AMP Incorporated, Harrisburg, Pa.

[21] Appl. No.: 736,161

[22] Filed: Jul. 26, 1991

[51] Int. Cl.⁵ ............................................. G01R 31/08
[52] U.S. Cl. ........................................ 324/540; 324/539; 29/593
[58] Field of Search .................. 29/593, 705; 324/537, 324/538, 539, 540

[56] References Cited

U.S. PATENT DOCUMENTS

| | | | |
|---|---|---|---|
| 2,912,648 | 11/1959 | Wales | 324/540 |
| 3,430,135 | 2/1969 | Mullen | 324/540 |
| 3,818,329 | 6/1974 | Reaves, Jr. | 324/540 |
| 3,982,180 | 9/1976 | Vaiden | 324/540 |
| 4,015,200 | 3/1977 | Strandh | 324/540 |
| 4,110,880 | 9/1978 | Peppler et al. | 29/33 |
| 4,114,091 | 9/1978 | Howard | 324/538 X |
| 4,285,118 | 8/1981 | Peppler et al. | 29/593 |
| 4,399,400 | 8/1983 | Rockwell et al. | 324/66 X |
| 4,536,703 | 8/1985 | Jablway et al. | 324/540 |
| 4,736,158 | 4/1988 | McCartney | 324/539 X |
| 4,870,752 | 10/1989 | Brown et al. | 29/866 |
| 4,903,403 | 2/1990 | Brown et al. | 29/861 |
| 4,937,519 | 6/1990 | Fields, III | 324/540 X |
| 5,027,074 | 6/1991 | Haferstat | 324/539 |

FOREIGN PATENT DOCUMENTS 0164570 12/1985 European Pat. Off. .

*Primary Examiner*—Jack B. Harvey
*Assistant Examiner*—Glenn W. Brown
*Attorney, Agent, or Firm*—William B. Noll

[57] ABSTRACT

A machine for making and testing a cable harness assembly having planar, multi-conductor cable terminated to insulation displacement contacts housed in connectors. The machine includes a test module having a programmed microprocessing unit for executing the testing procedure. A series of manually operable switches are provided, the conditions of which are detectable by the computer. These switches are then set to indicate the number of contacts present in the connectors being terminated and to indicate which of these contact positions are to be tested. Additionally, the order of correspondence of the contacts of one connector to the other connector may be reversed by actuating a forward/reverse switch. The test module includes a learn mode, where a cable assembly of known configuration is placed into the machine. The test module then determines the continuity paths of the cable assembly and uses that information to test subsequently made cable assemblies.

11 Claims, 7 Drawing Sheets

CABLE TESTING METHOD AND APPARATUS

This invention is directed to a method and apparatus for making and testing a cable assembly for shorts and opens.

BACKGROUND OF THE INVENTION

The present invention relates to the testing of cable harness assemblies having planar, multi-conductor cable terminated to insulation displacement contacts (IDC) housed in connectors. Such cable assemblies, their manufacture and testing are disclosed in U.S. Pat. Nos. 4,110,880 and 4,285,118 which issued to Peppler, et al., on Sep. 5, 1978 and Aug. 25, 1981 respectively and U.S. Pat. Nos. 4,870,752 and 4,903,403 which issued to Brown, et al., on Oct. 3, 1989 and Feb. 27, 1990 respectively, these patents being incorporated by reference as though set forth verbatim herein. The first two patents to Peppler, et al. disclose a cable harness making machine that performs an electrical test of the conductive paths for shorts and opens. A manually operable switch is provided for indicating the number of conductors in the cable. Therefore, a switch setting of six would indicate that the planar cable has six conductors and the corresponding connectors to be terminated to the cable have six contacts. If a four conductor cable were to be terminated to this six contact connector, however, there is no way to indicate which four contacts to test for shorts, opens, and continuity.

The two Brown, et al. patents disclose a cable harness making machine that performs electrical testing for shorts and opens at various stages of manufacture of the harness so that a connector will not be inadvertently terminated to a partially completed harness assembly that is defective. As with Peppler, et al., the testing device of Brown, et al. discloses no way to indicate which contacts should be tested when less than all contacts are being used. Additionally, both Peppler, et al. and Brown, et al. disclose testing that is executed in a pre-specified ordering of contacts, that is, pin one of one connector is always tested for continuity with pin one of an adjacent connector. Such a system would not be suitable when several cable assemblies are to be tested, each having a different ordering of contacts.

What is needed is a machine for making and testing a cable assembly having the capability to be directed as to which contacts of a connector are to be tested. Additionally desirable, is a testing capability which will examine a known good cable assembly, determining the contact ordering and continuity paths, and then testing subsequently made cable assemblies to this criteria.

SUMMARY OF THE INVENTION

The present invention includes a cable making machine for making cable assemblies including a cable having conductors terminated to contacts of a first connector at one end and contacts of a second connector at the other end. Testing means is included for testing electrical continuity between the contacts of the first and second connectors wherein each contact of the first connector has a one to one correspondence with a contact of the second connector. The testing means includes a first and second set of probes for making electrical contact with the contacts of the first and second connectors respectively. Continuity means is provided for testing electrical continuity between the probes of the first set, in either a predetermined order of correspondence or a learned order of correspondence.

DESCRIPTION OF THE PREFERRED EMBODIMENT

Figure 1:
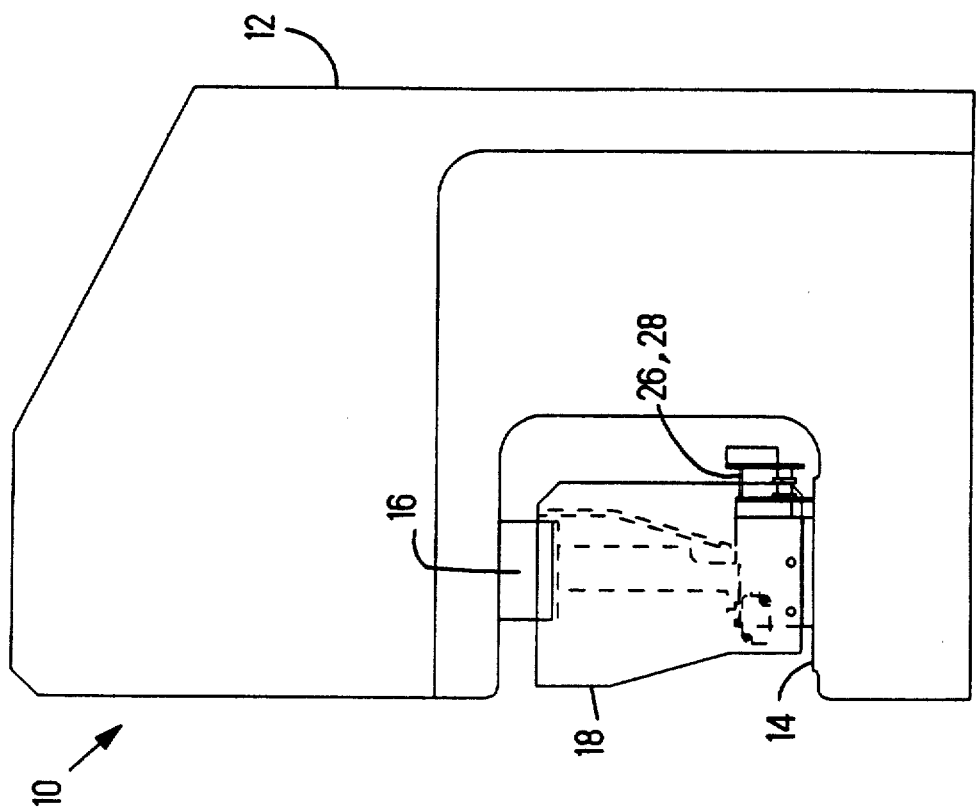
FIG. 1 is a side view of a cable making machine showing a press and terminating module.
Figure 2:
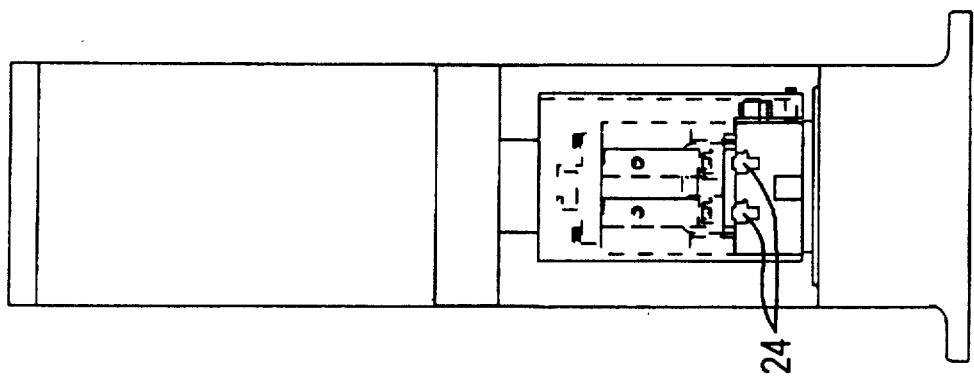
FIG. 2 is a front view of the machine of FIG. 1.
Figure 3:
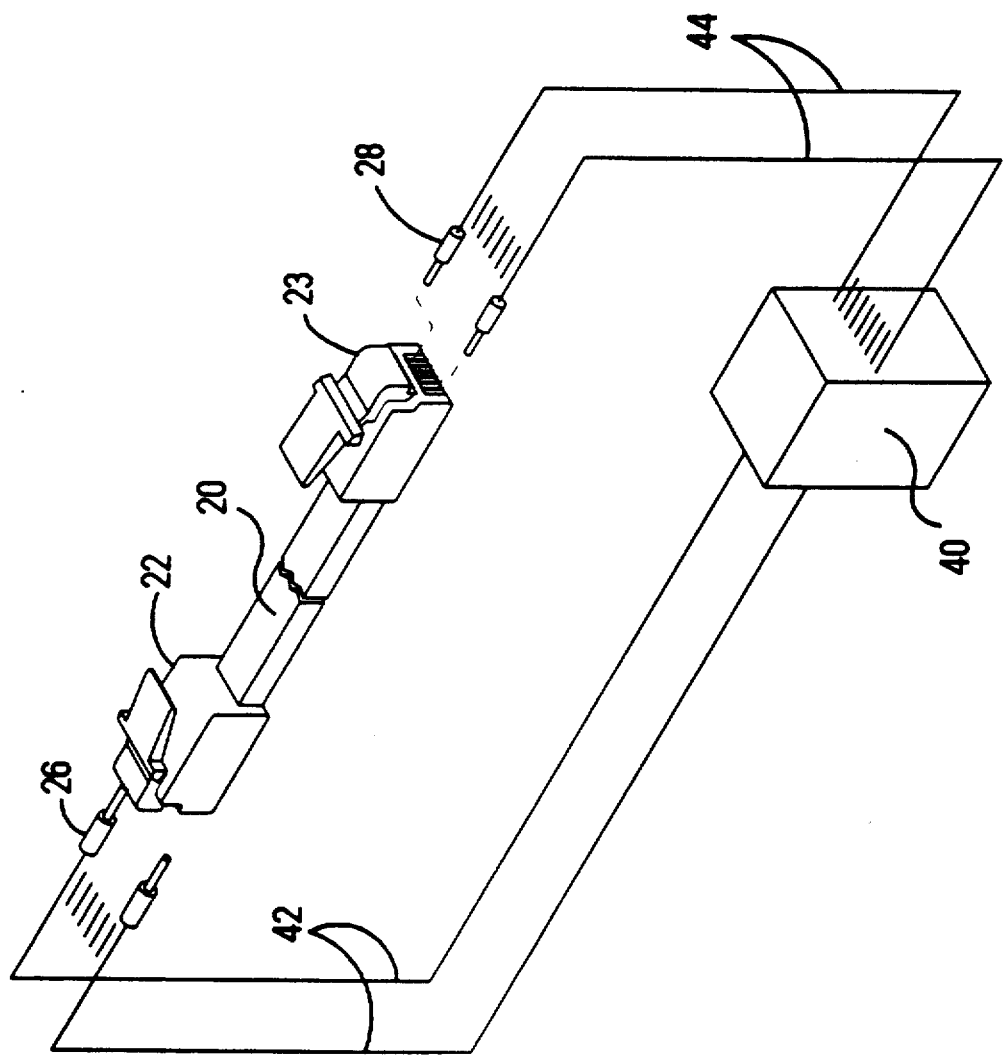
FIG. 3 is a schematic showing the relationship of a typical cable assembly to the testing apparatus of the present invention.

There is shown in FIGS. 1 and 2 a cable making machine 10 including a press 12 having a base 14 and a ram 16, moveable toward and away from the base 14. A connector terminating module 18 is secured to the base 14 and coupled to the ram 16 in the usual manner so that when the press 12 is actuated, the ram 16 causes the module 18 to terminate a pair of connectors, one to each end of a length of cable. The cable assembly is shown in FIG. 3 where a length of cable 20 has a connector 22,23, in the present example a modular plug, attached to each end. The connector terminating module 18 includes a pair of openings 24 for receiving the two modular plugs 22 and 23. An array of probes 26 is arranged to engage and make electrical contact with the contacts of the modular plug 22 and a second array of probes 28 is arranged to engage and make electrical contact with the contacts of the other modular plug 23. Each individual probe 30 of the two arrays 26 and 28 is spring biased toward the modular plugs 22 and 23 so that the probes engage and are maintained in good electrical contact with the individual contacts of the plugs. Any suitable electrical probe may be used here, for example, see the probe and its mounting as disclosed in the above referenced U.S. Pat. No. 4,285,118. As shown in FIG. 3, the two arrays of probes 26 and 28 are interconnected to a test module 40 by means of the circuits 42 and 44 respectively.

Figure 4:
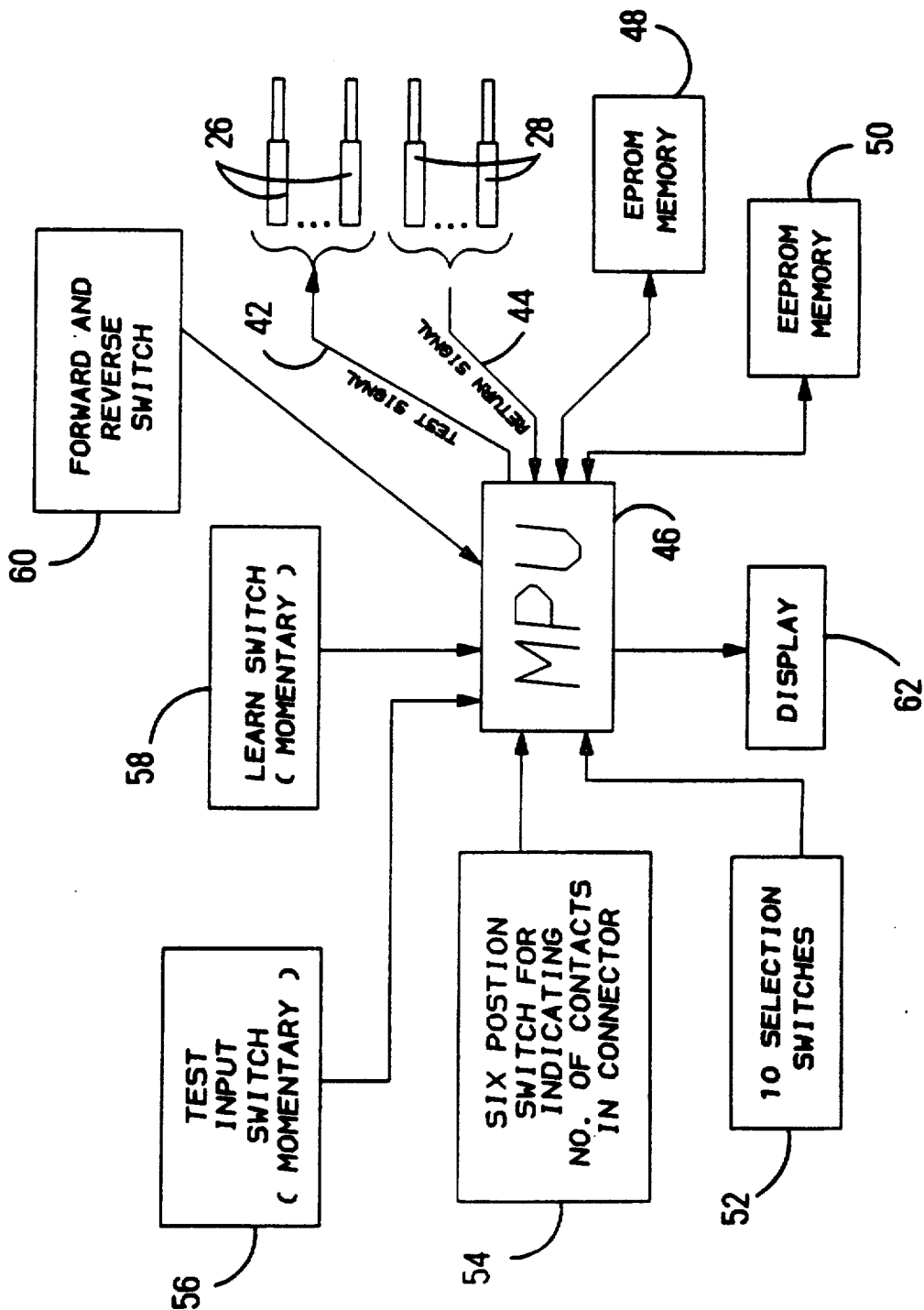
FIG. 4 is a block diagram showing the various functional components of the machine of FIG. 1.

There is shown in FIG. 4 a block diagram depicting the major functional elements of the test module 40. Central to the test module 40 is a microprocessor 46 which, in the present example is a 80C535 microprocessor, manufactured by Siemans Components,Inc. of Santa Clara, Calif., an EPROM memory 48, and an EEPROM memory 50. The EPROM memory 48 contains the coded instructions which control the operation of the test module 40. The EEPROM memory 50, on the other hand, is used to store the order of correspondence of the contacts of the modular plug 22 to the contacts of the modular plug 23 and thereby define the continuity paths for a particular cable assembly. The purpose of this will be set forth below in greater detail. There are a number of manually operable switches, the condition of which may be sensed by the computer 46 which are set by the operator to define the characteristics of the cable assembly to be tested. The manually operable switches are ten selection switches 52, a six position rotary switch 54, a momentary test input switch 56, a momentary learn switch 58, and a forward and reverse switch 60.

The six position rotary switch 54 is used to indicate the number of contacts in the modular plugs 22 and 23. The first five positions correspond to 2, 4, 6, 8, and 10 contacts per modular plug. The sixth position indicates that the test module is using test criteria that it had previously learned and stored in the EEPROM memory 50. The use of this sixth position will be described further below. The ten selection switches 52 are individual toggle type switches which indicate which of the contacts specified by the six position switch 54 are to be actually tested. For example, if the six position switch is set to indicate six contacts and a four conductor cable 20 is being terminated to the six contact modular plugs 22 and 23, the ten selector switches 52 would be set to indicate that either the first four or last four contacts should be used, or that contacts 2 through 5 should be used. This is accomplished by simply opening the switches 52 which correspond to the contact positions not being used and closing the remaining switches 52. The test input switch 56 is a momentary switch which returns to its normally open position when actuated and then released. This switch is actuated by the press to initiate automatic electrical testing of each cable assembly immediately after the modular plugs 22 and 23 are terminated to the ends of the cable 20. Once established, this automatic testing mode will continue until the system is reset or the learn switch 58 is actuated. The learn switch 58 is also a momentary switch which returns to its normally open position when released. Actuation of this switch causes the test module 40 to enter learn mode where the cable that is currently in the machine 10 is examined and the continuity paths determined. The forward and reverse switch 60 is a toggle or slide switch which indicates whether the order of correspondence of the contacts in the two modular plugs 22 and 23 should be tested for continuity as though contacts 1 through n of plug 22 were connected to contacts 1 through n of plug 23 respectively or as though contacts 1 through n of plug 22 were connected to contacts n through 1 of plug 23 respectively. The results of the test is indicated on a display 62 which consists of an array of light omitting diodes (LED). There is one LED for each possible modular plug contact position, ten in the present example, as well as one to indicate an open, one to indicate a short, and one to indicate a good cable.

The operation of the machine 10 during the test and learn modes is shown in the diagrams of FIGS. 5, 6, 7, and 8. Prior to initiating the test or learn modes, the six position switch 54 would be manually set to indicate the number of possible contact positions in the connectors 22 and 23 and prior to initiating the test mode the appropriate selection switches 52 are set indicating which contacts are to be tested. By way of example we shall assume that the six position switch is set to indicate a six contact connector 22,23 and that selection switches 52 for positions 2, 3, 4, and 5 are closed while the remaining selection switches are open. Additionally, the forward and reverse switch 60 is set as desired. To begin operation a pneumatic foot switch is actuated by the operator to cause the press 12 to terminate the connectors 22 and 23 to the ends of the cable 20 and actuate the test input switch 56. The probes 26 are in electrical engagement with the contacts of the connector 22 and the probes 28 are in electrical engagement with the contacts of the connector 23. As shown in FIGS. 5 through 8, the test input switch and the learn input switch are examined to determine their condition, as shown at 100 and 102 respectively. If both switches are open then a determination is made whether or not the last cable tested was good, as shown at 104. If the last cable tested was good the display 62 is reset, as shown at 106, and in any case control returns to test input switch at 100. In the event that the test input switch 56 is closed then the six position switch 54 is examined to determine the number of contacts in the connector as shown at 108 in FIG. 6. The six position switch 54 being set to positions 0 through 4 indicates the number of contacts to be 2, 4, 6, 8, or 10 respectively. If the switch 54 is set in position 5, this is indicated as "other" in FIG. 6 and will be described below. In our example the six position switch is set to position 2 indicating a six contact connector 22,23. Which of these six contacts are actually being used is then determined, as shown at 110 of FIG. 6, by examining the ten selection switches 52 as described above. This will limit testing to only those contacts which, in our example are contacts 2, 3, 4, and 5. The forward and reverse switch 60 is then examined and if open the cable continuity information and order of correspondence of the contacts is established in forward order by associating contacts 2 through 5 of the connector 22 with contacts 2 through 5 of the connector 23 as shown at 112 in FIG. 6. If the forward and reverse switch 60 had been closed then a reverse ordering would be established by associating contacts 2 through 5 of the connector 22 with contacts 5 through 2 of the connector 23 respectively, as shown at 114. In either case a continuity test is performed on the cable assembly, as shown at 116 of FIG. 7, using the cable information previously set up at 112 or 114. If any opens are detected, the open LED is illuminated as well as the appropriate contact position LEDs thereby indicating which contact positions are open, as shown at 118 of FIG. 7. Control is then returned to 100 of FIG. 5. If there are no opens but there are shorts detected, the short LED is illuminated as well as the appropriate contact position LEDs thereby indicting which contact positions are shorted, as shown at 120 of FIG. 7. Control is then returned to 100 of FIG. 5. If no opens nor shorts are detected then the good LED is illuminated as shown at 122 and control is returned to 100 of FIG. 5.

Figure 5:
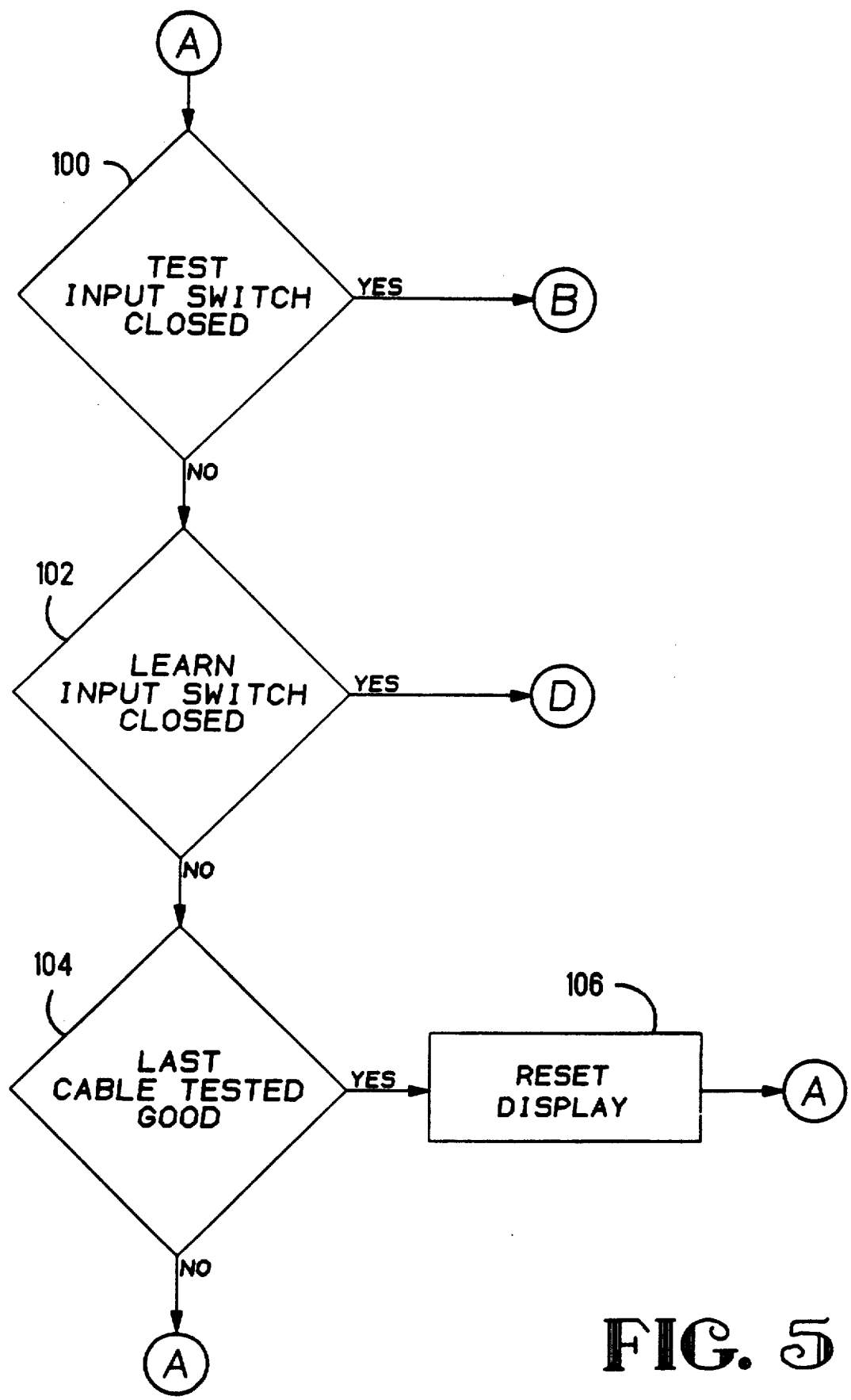
FIGS. 5, 6, 7, and 8 illustrate the operation of the testing of a cable in accordance with the teachings of the present invention.
Figure 6:
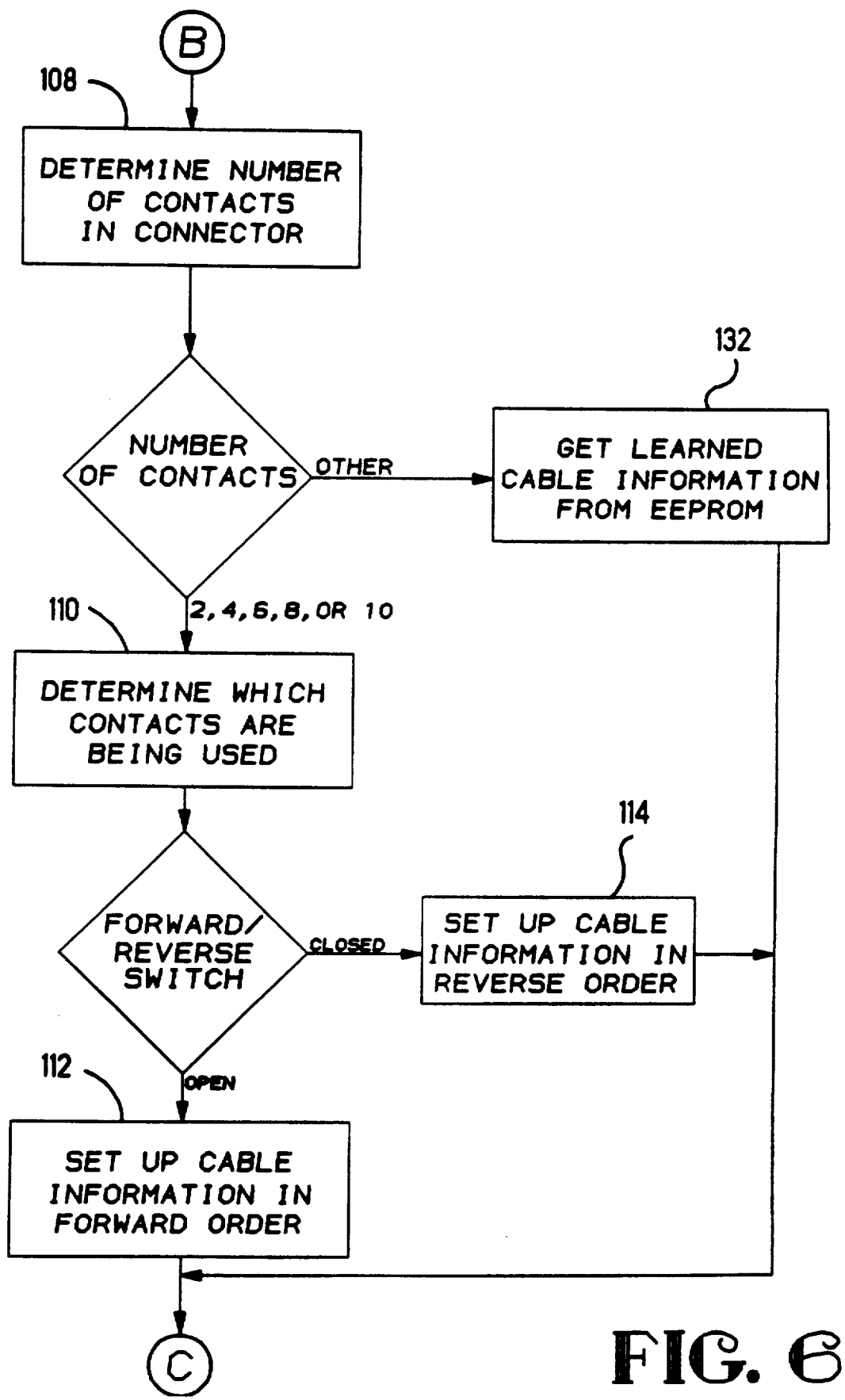
Figure 7:
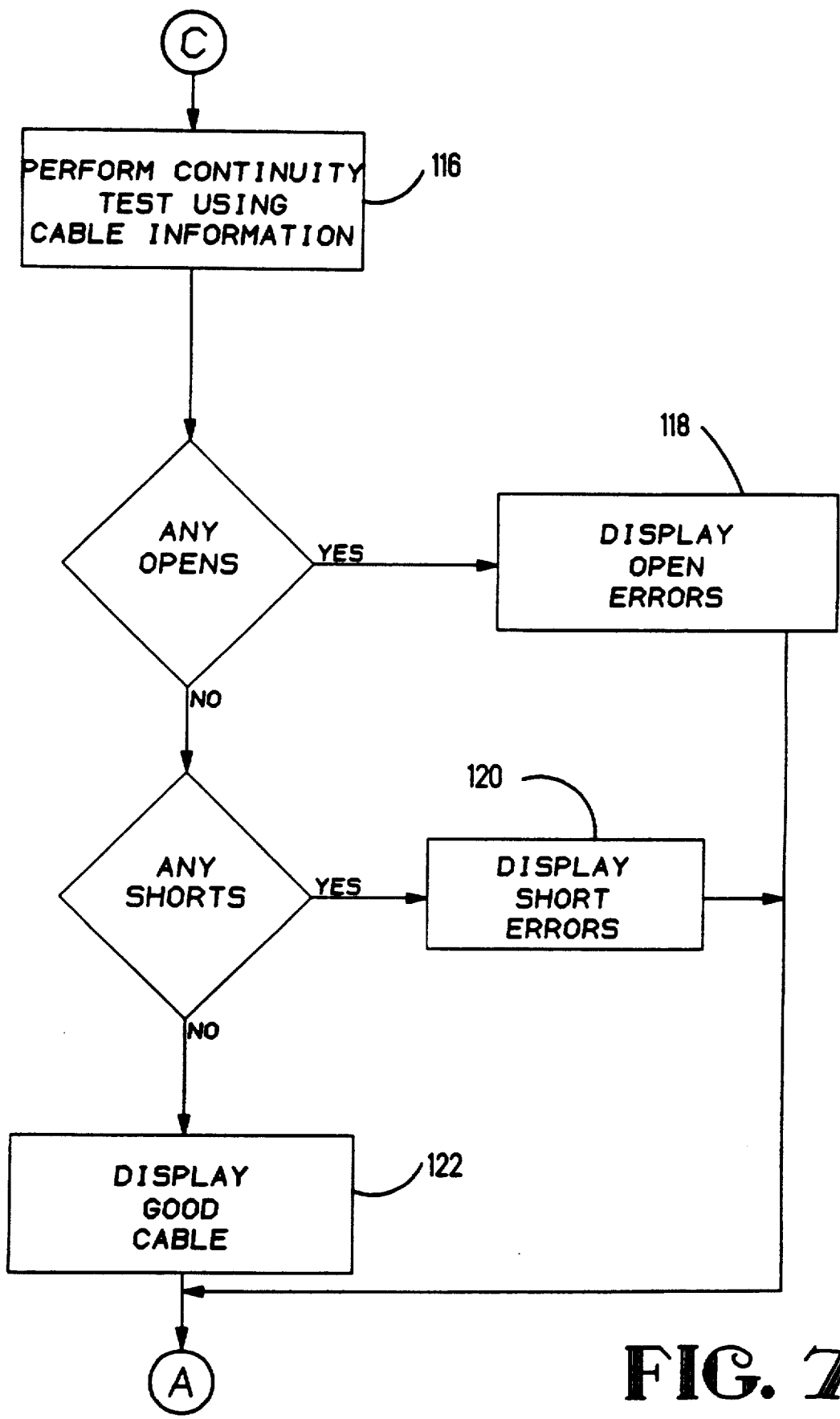
Figure 8:
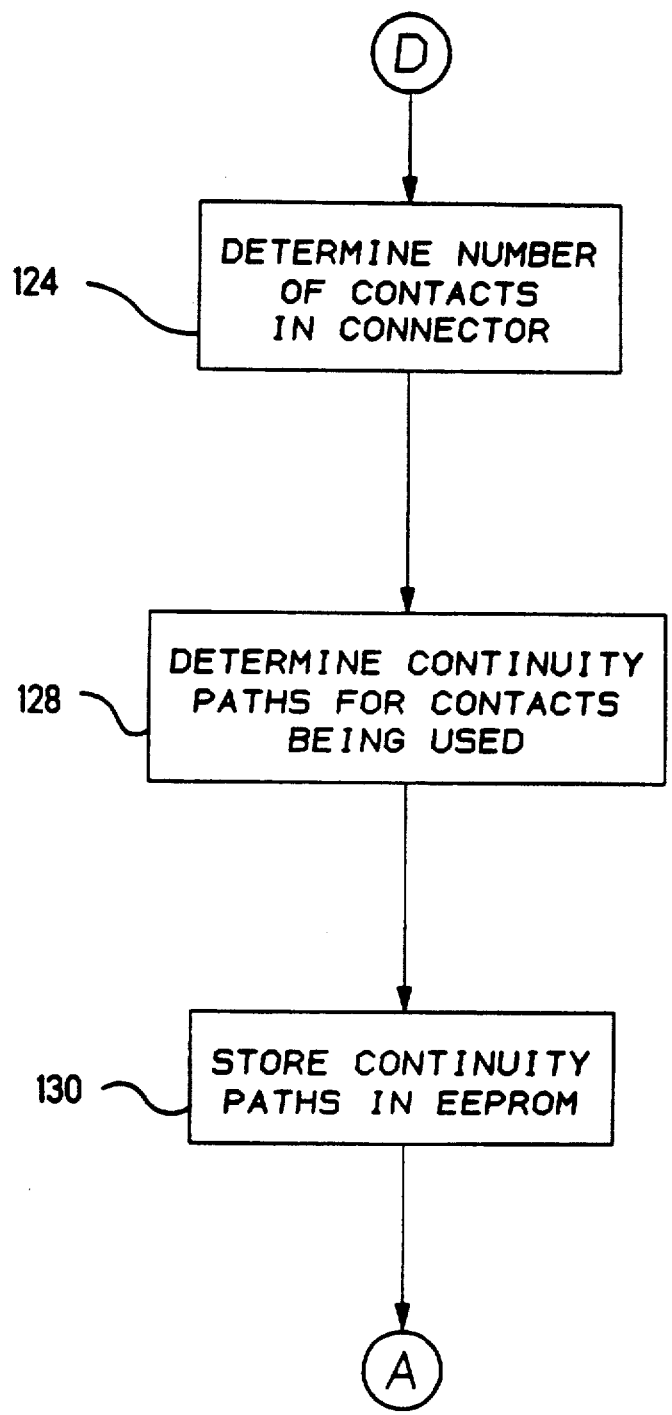

In the event that the test input switch 56 is open and the learn input switch 58 is closed, as shown at 100 and 102 in FIG. 5, the test module 40 enters the learn mode which is illustrated in FIG. 8. Again, the six position switch 54 is examined to determine the number of contacts in the connector 22,23, as shown at 124 of FIG. 8. All possible continuity paths for these contacts are then determined and this information is stored in the EEPROM memory 50 as shown at 128 and 130 of FIG. 8. Control is then returned to 100 of FIG. 5. Once this procedure is complete, the six position switch 54 is manually set to position 5 prior to operating the press 12. The press is then operated causing the test input switch 56 to be momentarily closed and control passed from 100 of FIG. 5 to 108 of FIG. 6. Since the six position switch 54 is set on position 5 which indicates other than 2, 4, 6, 8, or 10 contacts. The learned cable information that was previously stored in the EEPROM memory 50 is retrieved as at 132 of FIG. 6, and used in performing the continuity test as shown at 116 of FIG. 7.

During the testing for opens and shorts the computer 46 initiates a suitable signal, ground in the present example, which is impressed on the circuits 42, one at a time and a corresponding return signal on one or more of the circuits 44 is analyzed by the computer 46 and the condition of the cable under test is determined. This procedure, as depicted in FIGS. 5, 6, 7, and 8, is embodied in a set of coded instructions, shown in Appendix A, which resides in the EPROM memory 48 and controls the computer 46 and the conduct of the testing being performed by the test module 40.

An important advantage of the present invention is that the test module has the capability of testing cable assemblies having a number of cable conductors that is different than the number of contacts in the connectors. This includes the capability to specify exactly which connector contacts are to be tested at the exclusion of the other contacts. Additionally, the test module has the capability of learning the continuity paths of a known good cable assembly and then testing all subsequently manufactured cable assemblies in accordance with the characteristics of that known cable assembly.

APPENDIX A

COPYRIGHT 1991
AMP INCORPORATED
ALL RIGHTS RESERVED

```
$REGISTERBANK(0)
    $ROM(large)
    $TITLE
    $SYMBOLS

/*******************************************************************\
:                                                                   :
:        MODULE: MODPLUG - Main Module                              :
:        PROJECT: MOD PLUG TESTER                                   :
:        AUTHOR:  Matthew Miller                                    :
:        DATE:    June 3, 1991           VER 1.2                    :
:                                                                   :
:        DESCRIPTION:                                               :
:                                                                   :
:                                                                   :
:        TABLE OF CONTENTS:                                         :
:                                                                   :
:                                                                   :
:                                                                   :
:                                                                   :
:                                                                   :
:                                                                   :
\*******************************************************************/ modplug: DO;

$INCLUDE(RED51.DCL)

DECLARE DC              LITERALLY 'DECLARE';
    DC LIT                  LITERALLY 'LITERALLY';

DC forever              LIT 'WHILE 1';
    DC true                 LIT 'OFFh';
    DC false                LIT '000h';
    DC on                   LIT 'OFFh';
    DC off                  LIT '000h';
    DC up                   LIT 'OFFh';
    DC down                 LIT '000h';

DC light_show_duration  LIT '150';
    DC light_show_delay     LIT '1000';
```

```
DC latch_1_out        BYTE AT (1011$1111$1111$1111b) AUXILIARY;
DC latch_2_out        BYTE AT (0111$1111$1111$1111b) AUXILIARY;

DC switch_input       BYTE;
DC output_status (4)  BYTE;

DC cable_information (10)      STRUCTURE (
   output_position             BYTE,
   input_position              BYTE);
DC number_of_positions_in_cable BYTE;
DC last_cable_good_flag        BYTE;
DC time_delay_count            WORD;
DC light_show_count            WORD;
DC light_show_position         BYTE;
DC light_show_direction        BYTE;
DC time_index                  BYTE;
DC i                           BYTE;
DC read_op            LIT '02H';
DC short_delay        LIT 'C_TIME(1)';    /* About 100 uSec delay
DC write_disable_op   LIT '00H';
DC write_enable_op    LIT '0FH';
DC write_op           LIT '04H';
DC eeprom_data        WORD;
DC (eeprom_data_high,
    eeprom_data_low)  BYTE AT (.eeprom_data);
DC eeprom_loc         BYTE;
DC eeprom_data_in     LIT 'T1';
DC eeprom_third       BYTE;
DC eeprom_ck_flag     BYTE;

$INCLUDE(iolits.inc)

/*----------------------------------------------------*/
$EJECT
/*----------------------------------------------------*/ set_output: PROCEDURE (port_num, mask, sense);
DC port_num BYTE;
DC mask     BYTE;
DC sense    BYTE;

output_status(port_num) = (output_status(port_num) AND (NOT mask)) OR
                         (mask AND sense);
DO CASE port_num;

DO;                                     /* P1. */
    P1 = output_status(0);
  END;

DO;                                     /* P3. */
    P3 = output_status(1);
  END;

DO;                                     /* A14 latch. */
    latch_1_out = output_status(2);
  END;
```

```
          DO;                                          /* A15 latch. */
            latch_2_out = output_status(3);
          END;

END;   /* DO CASE port_num; */

END set_output;

/*----------------------------------------------------------------*/
$EJECT
/*----------------------------------------------------------------*/ turn_on_diagnostic_led: PROCEDURE (which_led);
      DC which_led BYTE;

IF (which_led <= 10) THEN
        DO CASE (which_led - 1);
          CALL set_output(turn_on_led1);
          CALL set_output(turn_on_led2);
          CALL set_output(turn_on_led3);
          CALL set_output(turn_on_led4);
          CALL set_output(turn_on_led5);
          CALL set_output(turn_on_led6);
          CALL set_output(turn_on_led7);
          CALL set_output(turn_on_led8);
          CALL set_output(turn_on_led9);
          CALL set_output(turn_on_led10);
        END;   /* DO CASE (which_led - 1); */

END turn_on_diagnostic_led;

/*----------------------------------------------------------------*/
$EJECT
/*----------------------------------------------------------------*/ turn_off_diagnostic_led: PROCEDURE (which_led);
      DC which_led BYTE;

IF (which_led <= 10) THEN
        DO CASE (which_led - 1);
          CALL set_output(turn_off_led1);
          CALL set_output(turn_off_led2);
          CALL set_output(turn_off_led3);
          CALL set_output(turn_off_led4);
          CALL set_output(turn_off_led5);
          CALL set_output(turn_off_led6);
          CALL set_output(turn_off_led7);
          CALL set_output(turn_off_led8);
          CALL set_output(turn_off_led9);
          CALL set_output(turn_off_led10);
        END;   /* DO CASE (which_led - 1); */

END turn_off_diagnostic_led;

/*----------------------------------------------------------------*/
$EJECT
/*----------------------------------------------------------------*/
```

```
write_instruction : PROCEDURE (opcode);

/****************************************************************/
/*                                                              */
/*              Ver 1.0          03/20/91                       */
/*                                                              */
/* Abstract:    Writes an instruction with the opcode of 'opcode' and the */
/*              address in the global variable 'eeprom_loc' to EEPROM.    */
/*              If the instruction does not require an address, the 4     */
/*              address bits are set to 0.                                */
/*                                                              */
/* Usage:       Called from local procedures.                   */
/*                                                              */
/* Author:      M. Strong                                       */
/*                                                              */
/****************************************************************/

DC opcode           BYTE;

DC bit_count        BYTE;
   DC writing          BIT;

IF opcode = write_op THEN              /* If write instruction    */
      writing = true;                     /* Set writing flag        */
   ELSE
      writing = false;                    /* If not write instruction*/
                                          /* Clear writing flag      */ opcode = SHL(opcode,4);                /* Put opcode in bits 7-4  */
                                          /* If 2 MSBs of opcode not */
   IF (opcode AND 0CCH) <> 0 THEN         /* both 0, address required*/
      opcode = opcode OR (eeprom_loc AND 0FH);  /* OR in address bits */

CALL set_output(eeprom_cs_on);         /* Raise EEPROM chip sele  */
   short_delay;

CALL set_output(eeprom_clock_high);    /* Raise EEPROM clock high */
   short_delay;                           /* Delay half clock period */

CALL set_output(eeprom_clock_low);     /* Lower EEPROM clock      */
   CALL set_output(eeprom_data_out_high); /* Write out start bit (1) */
   short_delay;                           /* Delay half clock period */

CALL set_output(eeprom_clock_high);    /* Clock in stop bit       */
   short_delay;                           /* Delay half clock period */

DO bit_count = 0 TO 7;                 /* Shift out 8 bits        */

CALL set_output(eeprom_clock_low);  /* Lower EEPROM clock      */

IF (opcode AND 80H) = 0 THEN        /* If most signif bit 0    */
         CALL set_output(eeprom_data_out_low);   /* Output a 0       */
      ELSE
         CALL set_output(eeprom_data_out_high);  /* If most signif bit 1 */
                                                 /* Output a 1       */ short_delay;                        /* Delay half clock period */
```

```
  CALL set_output(eeprom_clock_high);        /* Clock in data bit       */ opcode = SHL(opcode,1);                    /* Shift next bit to MSB   */ short_delay;                               /* Delay half clock period */

END; /* DO bit_count */

CALL set_output(eeprom_clock_low);           /* Lower EEPROM clock      */

IF NOT(writing) THEN                         /* If not write instruction*/
   CALL set_output(eeprom_data_out_low);     /* Output a 0 to EEPROM    */

END write_instruction;

/*----------------------------------------------------*/
$EJECT
/*----------------------------------------------------*/ read_eeprom : PROCEDURE;

/************************************************************/
/*                                                          */
/*              Ver 1.0            03/05/91                 */
/*                                                          */
/* Abstract:    Read into the global variable 'eeprom_data' the word in */
/*              EEPROM at the location in the global variable 'eeprom_loc'. */
/*                                                          */
/* Usage:       Called from local procedures.               */
/*                                                          */
/* Author:      M. Strong                                   */
/*                                                          */
/************************************************************/

DC bit_count         BYTE;

CALL write_instruction(read_op);             /* Write read op code & adr*/
                                             /* (Clock left low)        */
short_delay;                                 /* Delay half clock period */

CALL set_output(eeprom_clock_h   ;           /* Clock out 1st data bit  */ short_delay;                                 /* Delay half clock period */ eeprom_data = 0;                             /* Initialize data all 0's */

DO bit_count = 0 TO 15;                      /* Read in 16 bits         */ eeprom_data = SHL(eeprom_data,1);         /* Shift data 1 bit to left*/

CALL set_output(eeprom_clock_low);        /* Lower EEPROM clock      */

IF eeprom_data_in THEN                    /* If serial data bit is 1 */
      eeprom_data_low = eeprom_data_low OR 1; /* Set least signific bit */ short_delay;                              /* Delay half clock period */
```

```
          CALL set_output(eeprom_clock_high);        /* Clock out next data bit */ short_delay;                               /* Delay half clock period */

END; /* DO bit_count */

CALL set_output(eeprom_clock_low);              /* Lower EEPROM clock       */

CALL set_output(eeprom_cs_off);                 /* Lower EEPROM chip select*/

END read_eeprom;

/*-----------------------------------------------------------------*/
$EJECT
/*-----------------------------------------------------------------*/ write_eeprom : PROCEDURE;

/*****************************************************************/
/*                                                               */
/*              Ver 1.0           03/20/91                       */
/*                                                               */
/* Abstract:   Writes the contents of the global variable 'eeprom_data' */
/*             into EEPROM at the location in the global variable */
/*             'eeprom_loc'. It first enables erasing and writing and */
/*             then erases the location. After writing, it disables */
/*             erasing and writing.                              */
/*                                                               */
/* Usage:      Called from local procedures.                     */
/*                                                               */
/* Author:     M. Strong                                         */
/*                                                               */
/*****************************************************************/

DC count           BYTE;

CALL write_instruction(write_enable_op);        /* Write enable opcode    */
                                                     /* (Clock left low)       */
     CALL set_output(eeprom_cs_off);                 /* Lower EEPROM chip select*/ short_delay;                                    /* Delay half clock period */
     CALL set_output(eeprom_clock_high);             /* Raise EEPROM clock in   */
                                                     /* prep for next instruct'n*/
     short_delay;                                    /* Delay half clock period */

CALL write_instruction(erase_op);               /* Write erase opcode & adr*/
                                                     /* (Clock left low)        */
     DO count = 0 TO 49;                             /* Allow 50 * 200 usec     */
                                                     /* = 10 msec for tE/W      */
       short_delay;                                  /* Delay half clock period */

CALL set_output(eeprom_clock_high);           /* Raise EEPROM clock      */ short_delay;                                  /* Delay half clock period */
```

```
    CALL set_output(eeprom_clock_low);         /* Lower EEPROM clock         */

END; /* DO count */ short_delay;                                   /* Delay half clock period */
CALL set_output(eeprom_clock_high);            /* Raise EEPROM clock in    */
                                               /* prep for next instruct'n*/
short_delay;                                   /* Delay half clock period */

CALL write_instruction(write_op);              /* Write write opcode & adr*/
                                               /* (Clock left low)         */
DO count = 0 TO 15;                            /* Shift out 16 bits        */

IF (eeprom_data_high AND 80H) = 0 THEN      /* If most signif bit a 0 */
      CALL set_output(eeprom_data_out_low);    /* Output a 0              */
   ELSE                                        /* If most signif bit a 1 */
      CALL set_output(eeprom_data_out_high);   /* Output a 1              */ short_delay;                                /* Delay half clock period */

CALL set_output(eeprom_clock_high);         /* Clock out data bit       */ eeprom_data = SHL(eeprom_data,1);           /* Shift next bit to MSB    */ short_delay;                                /* Delay half clock period */

CALL set_output(eeprom_clock_low);          /* Lower EEPROM clock       */

END; /* DO count */

CALL set_output(eeprom_data_out_low);          /* Output a 0 to EEPROM     */

CALL set_output(eeprom_cs_off);                /* Lower EEPROM chip select*/

DO count = 0 TO 49;                            /* Allow 50 * 200 usec      */
                                               /* = 10 msec for tE/W       */
   short_delay;                                /* Delay half clock period */

CALL set_output(eeprom_clock_high);         /* Raise EEPROM clock       */ short_delay;                                /* Delay half clock period */

CALL set_output(eeprom_clock_low);          /* Lower EEPROM clock       */

END; /* DO count */ short_delay;                                   /* Delay half clock period */
CALL set_output(eeprom_clock_high);            /* Raise EEPROM clock in    */
                                               /* prep for next instruct'n*/
short_delay;                                   /* Delay half clock period */

CALL write_instruction(write_disable_op);      /* Write disable opcode     */
                                               /* (Clock left low)         */
CALL set_output(eeprom_cs_off);                /* Lower EEPROM chip select*/ short_delay;                                   /* Delay half clock period */
```

```
CALL set_output(eeprom_clock_high);      /* Raise EEPROM clock in   */
short_delay;                              /* Delay half clock period */
CALL set_output(eeprom_clock_low);        /* Lower EEPROM clock      */

END write_eeprom;
```

/*---------------------------------------------------*/
$EJECT
/*---------------------------------------------------*/

```
eeprom_write_display: PROCEDURE (number_of_blinks);
DC number_of_blinks  BYTE;
DC (i, ii)           BYTE;

DO i = 1 TO number_of_blinks;
  IF (i <> 1) THEN
    DO time_index = 1 TO 25;
      CALL time(50);
    END;
  CALL set_output(turn_off_leds_1_to_8);
  CALL set_output(turn_off_leds_9_and_10);
  DO ii = 1 TO 5;
    CALL turn_on_diagnostic_led(6 - ii);
    CALL turn_on_diagnostic_led(5 + ii);
    DO time_index = 1 TO 30;
      CALL time(10);
    END;
  END;
  CALL set_output(turn_on_short_led);
  CALL set_output(turn_on_open_led);
  DO time_index = 1 TO 50;
    CALL time(50);
  END;
  CALL set_output(turn_off_leds_1_to_8);
  CALL set_output(turn_off_all_other_leds);
END;

END eeprom_write_display;
```

/*---------------------------------------------------*/
$EJECT
/*---------------------------------------------------*/

```
fatal_eeprom_error: PROCEDURE (number_of_blinks);
DC number_of_blinks  BYTE;
DC i                 BYTE;

i = number_of_blinks + 1;
DO WHILE (i <> 0);
  CALL set_output(turn_on_leds_1_to_8);
  CALL set_output(turn_on_all_other_leds);
  DO time_index = 1 TO 75;
    CALL time(50);
  END;
  CALL set_output(turn_off_leds_1_to_8);
  CALL set_output(turn_off_all_other_leds);
```

```
    DO time_index = 1 TO 50;
      CALL time(50);
    END;
    IF (number_of_blinks <> 0) THEN
      i = i - 1;
  END;
  eeprom_ok_flag = false;

END fatal_eeprom_error;

/*--------------------------------------------------------------*/
H..LCT
/*--------------------------------------------------------------*/ write_current_cable_to_eeprom: PROCEDURE;
DC i                BYTE;
DC local_eeprom_word  WORD;

try_to_write_eeprom_again:

i = 0;
eeprom_loc = (eeprom_third * 5) + 1;
DO WHILE (i <= 9);
  eeprom_data_high = SHL(cable_information(i).output_position, 4) OR
                     cable_information(i).input_position;
  i = i + 1;
  eeprom_data_low = SHL(cable_information(i).output_position, 4) OR
                    cable_information(i).input_position;
  i = i + 1;
  local_eeprom_word = eeprom_data;
  CALL write_eeprom;
  CALL read_eeprom;
  IF (eeprom_data <> local_eeprom_word) THEN
    DO;
      eeprom_third = eeprom_third + 1;
      IF (eeprom_third > 2) THEN
        CALL fatal_eeprom_error(5);
      ELSE
        DO;
          eeprom_loc = 0;
          eeprom_data_high = 'M';
          eeprom_data_low = 10h OR (eeprom_third AND 03h);
          CALL write_eeprom;
          CALL eeprom_write_display(5);
          CALL read_eeprom;
          IF (eeprom_data_high <> 'M') OR
             (eeprom_data_low <> (10h OR (eeprom_third AND 03h))) THEN
            CALL fatal_eeprom_error(5);
          ELSE
            GOTO try_to_write_eeprom_again;
        END;
    END;
  eeprom_loc = eeprom_loc + 1;
END;

CALL eeprom_write_display(1);
```

```
END write_current_cable_to_eeprom;

/*----------------------------------------------------------*/
$EJECT
/*----------------------------------------------------------*/ read_current_cable_from_eeprom: PROCEDURE;
DC i            BYTE;
DC byte_value   BYTE;

i = 0;
eeprom_loc = (eeprom_third * 5) + 1;
CALL read_eeprom;
DO WHILE (i <= 9);
  CALL read_eeprom;
  byte_value = eeprom_data_high;
  cable_information(i).output_position = (SHR(byte_value, 4) AND 00Fh);
  cable_information(i).input_position = (byte_value AND 00Fh);
  i = i + 1;
  byte_value = eeprom_data_low;
  cable_information(i).output_position = (SHR(byte_value, 4) AND 00Fh);
  cable_information(i).input_position = (byte_value AND 00Fh);
  i = i + 1;
  eeprom_loc = eeprom_loc + 1;
END;

number_of_positions_in_cable = 0;
DO i = 0 TO 9;
  IF (cable_information(i).output_position <> 0) THEN
    number_of_positions_in_cable = number_of_positions_in_cable + 1;
  IF (cable_information(i).output_position = 11) THEN
    cable_information(i).output_position = 0;
END;

END read_current_cable_from_eeprom;

/*----------------------------------------------------------*/
$EJECT
/*----------------------------------------------------------*/ eeprom_init: PROCEDURE;

/**************************************************************/
/*                                                            */
/*              Ver 1.0           03/06/91                    */
/*                                                            */
/* Abstract:  Checks if the EEPROM has been initialized and initializes */
/*            it if it has not been.  It prints an error message if the */
/*            EEPROM has not been initialized or if the initialization  */
/*            fails.                                          */
/*                                                            */
/*            The first word of EEPROM is the initialization word and   */
/*            has the following format :                      */
/*                                                            */
/*                    | 1 1 1 1 1 1 1 |             |         */
/*                    | 5 4 3 2 1 0 9 8 7 6 5 4 3 2 1 0 |     */
```

```
/*                  +------------------+------+   */
/*                  ! 0 1 0 0 1 1 0 1 0 1 1!pointer!  */
/*                  !                  ! to   !   */
/*                  !     (405H)       !current!  */
/*                  !                  ! loc  !   */
/*                  !                  ! (1-3)!   */
/*                                                */
/* Usage:    Called from main program on power-up.  */
/*                                                */
/* Author:   M. Strong                            */
/*                                                */
/************************************************/
DC i  BYTE;

CALL set_output(eeprom_data_out_low);       /* Initialize data out to 0*/
short_delay;                                /* Delay half clock period */ eeprom_loc = 0;                             /* Point to 1st EEPROM loc */
CALL read_eeprom;                           /* Read into 'eeprom_data' */

IF (eeprom_data_high <> 'M') OR             /* If 1st byte not 'M'    */
   ((eeprom_data_low AND 0F0h) <> 10h) THEN /* EEPROM not initialized */
DO;
   eeprom_data_high = 'M';
   eeprom_data_low = 10h;
   CALL write_eeprom;                       /* Bits 0-3 point to thrd 0*/

CALL eeprom_write_display(5);
   CALL read_eeprom;                        /* Read back init word     */

IF (eeprom_data_high <> 'M') OR          /* If 1st byte not 'M'    */
      ((eeprom_data_low AND 0F0h) <> 10h) THEN /* EEPROM not initialized */
      CALL fatal_eeprom_error(5);           /* Display EEPROM fail err */
   ELSE
      DO;
         eeprom_third = 0;                  /* Point to 1st EEPROM loc */

DO i = 0 TO 9;
            cable_information(i).output_position = (i + 1);
            cable_information(i).input_position = (i + 1);
         END;

CALL write_current_cable_to_eeprom;
      END;

END; /* IF */
ELSE                                        /* If EEPROM initialized   */
   DO;
      eeprom_third = eeprom_data_low AND 03H; /* Get current EEPROM third*/
                                              /* pointer from bits 0-1  */
      eeprom_ok_flag = true;
   END;

END eeprom_init;
```

```
/*----------------------------------------------------------*/
$EJECT
/*----------------------------------------------------------*/ turn_on_cable_test_output: PROCEDURE (which_output);
DC which_output  BYTE;

IF (which_output <= 10) THEN
  DO CASE (which_output - 1);
    CALL set_output(turn_on_out1);
    CALL set_output(turn_on_out2);
    CALL set_output(turn_on_out3);
    CALL set_output(turn_on_out4);
    CALL set_output(turn_on_out5);
    CALL set_output(turn_on_out6);
    CALL set_output(turn_on_out7);
    CALL set_output(turn_on_out8);
    CALL set_output(turn_on_out9);
    CALL set_output(turn_on_out10);
  END;  /* DO CASE (which_output - 1); */

END turn_on_cable_test_output;

/*----------------------------------------------------------*/
$EJECT
/*----------------------------------------------------------*/ turn_off_all_outputs: PROCEDURE;

CALL set_output(turn_off_outputs_2_to_9);
CALL set_output(turn_off_outputs_1_and_10);

END turn_off_all_outputs;

/*----------------------------------------------------------*/
$EJECT
/*----------------------------------------------------------*/ cable_test_input: PROCEDURE (which_input) BYTE;
DC which_input  BYTE;
DC byte_input   BYTE;

IF (which_input = 1) OR (which_input = 10) THEN
  DO;
    byte_input = P3;
    IF (which_input = 1) THEN
      byte_input = (byte_input AND 0000$0001b);
    ELSE
      byte_input = (byte_input AND 0000$0010b);
    IF (byte_input = 0) THEN
      RETURN (on);
    ELSE
      RETURN (off);
  END;
ELSE IF (which_input >= 2) AND (which_input <= 9) THEN
  DO;
```

```
        ADCON = (which_input - 2);
        DAPR = 0100$0000b;              /* IVAGND = 0V, IVAREF = 1.25V */
        DO WHILE BSY;
        END;
        byte_input = ADDAT;
        IF (byte_input <= 153) THEN
            RETURN (on);
        ELSE
            RETURN (off);
    END;

RETURN (off);

END cable_test_input;
```

/*----------------------------------------------------------------*/
$EJECT
/*----------------------------------------------------------------*/

```
toggle_switch_input: PROCEDURE (switch_number) BYTE;
DC switch_number  BYTE;
DC input_byte     BYTE;

IF (switch_number <= 2) THEN
    DO;
        input_byte = P4;
        IF ((input_byte AND ROL(0010$0000b, switch_number)) = 0) THEN
            RETURN (on);
        ELSE
            RETURN (off);
    END;

input_byte = P5;
IF ((input_byte AND ROL(0000$0001b, (switch_number - 3))) = 0) THEN
    RETURN (on);
ELSE
    RETURN (off);

END toggle_switch_input;
```

/*----------------------------------------------------------------*/
$EJECT
/*----------------------------------------------------------------*/

```
read_knob_position: PROCEDURE BYTE;
/*--------------------------------------------------------------*/
    read_knob_input: PROCEDURE BYTE;
    DC done       BYTE;
    input_sense = (P4 AND 00000111
    done = false;
    DO WHILE (done = false);
        CALL time(100);
        IF (input_sense = (P4 AND 00000111b)) THEN
            done = true;
        ELSE
            input_sense = (P4 AND 00000111b);
    END;
```

```
    RETURN (input_sense);

END read_knob_input;
/*---------------------------------------------*/
  DC knob_input     BYTE;
  DC knob_position  BYTE;

CALL set_output(turn_off_switch_out_1);
  CALL set_output(turn_off_switch_out_2);

knob_input = read_knob_input;
  IF (knob_input = 011b) THEN
    knob_position = 0;
  ELSE IF (knob_input = 110b) THEN
    knob_position = 5;
  ELSE
   DO;
      CALL set_output(turn_on_switch_out_1);
      knob_input = read_knob_input;
      IF (knob_input = 110b) THEN
        knob_position = 4;
      ELSE IF (knob_input = 101b) THEN
        knob_position = 3;
      ELSE
        DO;
          CALL set_output(turn_off_switch_out_1);
          CALL set_output(turn_on_switch_out_2);
          knob_input = read_knob_input;
          IF (knob_input = 101b) THEN
            knob_position = 2;
          IF (knob_input = 011b) THEN
            knob_position = 1;
        END;
   END;

CALL set_output(turn_on_switch_out_1);
  CALL set_output(turn_on_switch_out_2);

RETURN (knob_position);

END read_knob_position;
/*---------------------------------------------*/
$EJECT
/*---------------------------------------------*/ init: PROCEDURE;
  DC i BYTE;

IE = 0;                            /* Disable all interrrupts. */

P1 = 0FFh;
  P3 = 0FFh;
  P4 = 0FFh;
  P5 = 0FFh;
  P6 = 0FFh;
```

```
latch_1_out = OFFh;
latch_2_out = OFFh;

output_status(0) = OFFh;
output_status(1) = OFFh;
output_status(2) = OFFh;
output_status(3) = OFFh;
CALL set_output(turn_off_beep);
CALL set_output(eeprom_cs_off);

last_cable_good_flag = true;
time_delay_count = 0;
light_show_count = light_show_duration;
light_show_position = 9;
light_show_direction = up;

CALL eeprom_init;

DO i = 1 TO 3;
  DO time_index = 1 TO 20;
    CALL time(100);
  END;
  CALL set_output(turn_on_beep);
  DO time_index = 1 TO 10;
    CALL time(100);
  END;
  CALL set_output(turn_off_beep);
END;

END init;

/*--------------------------------------------------*/
$EJECT
/*--------------------------------------------------*/ get_cable_information: PROCEDURE;
DC knob_position  BYTE;
DC flip_flag      BYTE;
DC i              BYTE;

knob_position = read_knob_position;
IF flip_input_switch_made THEN
  flip_flag = true;
ELSE
  flip_flag = false;

DO i = 0 TO 9;
  cable_information(i).output_position = 0;
  cable_information(i).input_position = 0;
END;

IF (knob_position > 5) THEN
  knob_position = 5;

DO CASE knob_position;
```

```
  DO;                                       /* Case 0. */
    number_of_positions_in_cable = 2;
    DO i = 0 TO 1;
      cable_information(i).output_position = (5 + i);
      IF (flip_flag = true) THEN
        cable_information(i).input_position = (6 - i);
      ELSE
        cable_information(i).input_position = (5 + i);
    END;

DO;                                       /* Case 1. */
    number_of_positions_in_cable = 4;
    DO i = 0 TO 3;
      cable_information(i).output_position = (4 + i);
      IF (flip_flag = true) THEN
        cable_information(i).input_position = (7 - i);
      ELSE
        cable_information(i).input_position = (4 + i);
    END;
  END;

DO;                                       /* Case 2. */
    number_of_positions_in_cable = 6;
    DO i = 0 TO 5;
      cable_information(i).output_position = (3 + i);
      IF (flip_flag = true) THEN
        cable_information(i).input_position = (8 - i);
      ELSE
        cable_information(i).input_position = (3 + i);
    END;
  END;

DO;                                       /* Case 3. */
    number_of_positions_in_cable = 8;
    DO i = 0 TO 7;
      cable_information(i).output_position = (2 + i);
      IF (flip_flag = true) THEN
        cable_information(i).input_position = (9 - i);
      ELSE
        cable_information(i).input_position = (2 + i);
    END;
  END;

DO;                                       /* Case 4. */
    number_of_positions_in_cable = 10;
    DO i = 0 TO 9;
      cable_information(i).output_position = (1 + i);
      IF (flip_flag = true) THEN
        cable_information(i).input_position = (10 - i);
      ELSE
        cable_information(i).input_position = (1 + i);
    END;
  END;

DO;                                       /* Case 5. */
    IF (eeprom_ok_flag = false) THEN
```

```
         DO;
           CALL fatal_eeprom_error(3);
           number_of_positions_in_cable = 10;
           DO i = 0 TO 9;
             cable_information(i).output_position = (1 + i);
             IF (flip_flag = true) THEN
               cable_information(i).input_position = (10 - i);
             ELSE
               cable_information(i).input_position = (1 + i);
           END;
         END;
       ELSE
         DO;
           CALL read_current_cable_from_eeprom;
         END;
     END;

END;   /* DO CASE knob_position; */

IF (knob_position <> 5) THEN                     /* Not a learned cable. */
    DO i = 1 TO number_of_positions_in_cable;
      IF (toggle_switch_input(i) = on) THEN
        cable_information(i - 1).output_position = 0;
    END;

END get_cable_information;

/*--------------------------------------------------------------*/
$EJECT
/*--------------------------------------------------------------*/ test_for_opens: PROCEDURE BYTE;
DC open_flag BYTE;
DC i         BYTE;

open_flag = false;
DO i = 1 TO number_of_positions_in_cable;
  IF (cable_information(i - 1).output_position <> 0) THEN
    DO;
      CALL turn_on_cable_test_output(cable_information(i - 1).output_position);
      IF (cable_test_input(cable_information(i - 1).input_position) <> on) THEN
        DO;
          CALL turn_on_diagnostic_led(i);
          open_flag = true;
        END;
      CALL turn_off_all_outputs;
    END;
END;

RETURN (open_flag);

END test_for_opens;

/*--------------------------------------------------------------*/
$EJECT
/*--------------------------------------------------------------*/
```

```
test_for_shorts: PROCEDURE BYTE;
DC shorts_flag BYTE;
DC i            BYTE;
DC input_index  BYTE;
DC input_byte   BYTE;

shorts_flag = false;
DO i = 1 TO number_of_positions_in_cable;
  IF (cable_information(i - 1).output_position <> 0) THEN
    DO;
      CALL turn_on_cable_test_output(cable_information(i - 1).output_position);
      DO input_index = 1 TO number_of_positions_in_cable;
        input_byte = cable_test_input(cable_information(input_index - 1).input_position);
        IF (input_index = i) THEN
          DO;
            IF (input_byte <> on) THEN
              DO;
                CALL turn_on_diagnostic_led(input_index);
                shorts_flag = true;
              END;
          END;
        ELSE
          DO;
            IF (input_byte <> off) THEN
              DO;
                CALL turn_on_diagnostic_led(input_index);
                shorts_flag = true;
              END;
          END;
      END;
      CALL turn_off_all_outputs;
      IF (shorts_flag = true) THEN
        DO;
          CALL turn_on_diagnostic_led(i);
          RETURN (true);
        END;
    END;
END;

RETURN (false);

END test_for_shorts;

/*————————————————————————————*/
$EJECT
/*————————————————————————————*/ error_beep: PROCEDURE;

CALL set_output(turn_on_beep);
DO time_index = 1 TO 100;
  CALL time(100);
END;
CALL set_output(turn_off_beep);

END error_beep;
```

```
/*-----------------------------------------------------------------*/
$EJECT
/*-----------------------------------------------------------------*/ run_cable_test: PROCEDURE;
  DC error  BYTE;
  DC i      BYTE;

last_cable_good_flag = false;
  CALL turn_off_all_outputs;
  error = test_for_opens;
  IF (error = true) THEN
    DO;
      CALL set_output(turn_on_open_led);
      CALL error_beep;
    END;
  ELSE
    DO;
      CALL turn_off_all_outputs;
      error = test_for_shorts;
      IF (error = true) THEN
        DO;
          CALL set_output(turn_on_short_led);
          CALL error_beep;
        END;
      ELSE
        DO;
          CALL set_output(turn_on_good_led);
          DO i = 1 TO 5;
            CALL turn_on_diagnostic_led(i);
            CALL turn_on_diagnostic_led(11 - i);
            DO time_index = 1 TO 30;
              CALL time(10);
            END;
          END;
          DO i = 1 TO 5;
            CALL turn_off_diagnostic_led(i);
            CALL turn_off_diagn._led(11 - i);
            DO time_index = 1 TO 30;
              CALL time(10);
            END;
          END;
          last_cable_good_flag = true;
          time_delay_count = light_show_delay;
          light_show_count = light_show_duration;
          light_show_position = 9;
          light_show_direction = up;
        END;
    END;

END run_cable_test;

/*-----------------------------------------------------------------*/
$EJECT
/*-----------------------------------------------------------------*/
```

```
test_cable: PROCEDURE;

CALL set_output(turn_off_leds_1_to_8);
   CALL set_output(turn_off_all_other_leds);
   CALL get_cable_information;
   CALL run_cable_test;

END test_cable;
```

/*————————————————————————————————————*/
$EJECT
/*————————————————————————————————————*/

```
learn_cable: PROCEDURE;
DC output_index   BYTE;
DC input_index    BYTE;
DC i              BYTE;
DC knob_position  BYTE;
DC temp           BYTE;

knob_position = read_knob_position;

DO i = 0 TO 9;
   cable_information(i).output_position = 0;
   cable_information(i).input_position = 0;
END;

IF (knob_position > 4) THEN
   knob_position = 4;

DO CASE knob_position;

DO;                                          /* Case 0. */
      number_of_positions_in_cable = 2;
      DO i = 0 TO 1;
         cable_information(i).output_position = (6 + i);
         cable_information(i).input_position = (6 + i);
      END;
   END;

DO;                                          /* Case 1. */
      number_of_positions_in_cable = 4;
      DO i = 0 TO 3;
         cable_information(i).output_position = (4 + i);
         cable_information(i).input_position = (4 + i);
      END;
   END;

DO;                                          /* Case 2. */
      number_of_positions_in_cable = 6;
      DO i = 0 TO 5;
         cable_information(i).output_position = (3 + i);
         cable_information(i).input_position = (3 + i);
      END;
   END;
```

```
   DO;                                          /* Case 3. */
     number_of_positions_in_cable = 8;
     DO i = 0 TO 7;
       cable_information(i).output_position = (2 + i);
       cable_information(i).input_position = (2 + i);
     END;
   END;

DO;                                          /* Case 4. */
     number_of_positions_in_cable = 10;
     DO i = 0 TO 9;
       cable_information(i).output_position = (1 + i);
       cable_information(i).input_position = (1 + i);
     END;
   END;

END;   /* DO CASE knob_position; */

CALL turn_off_all_outputs;
CALL time(10);
DO output_index = 0 TO (number_of_positions_in_cable - 1);
   CALL turn_on_cable_test_output(cable_information(output_index).output_position);
   input_index = 0;
   DO WHILE (input_index < number_of_positions_in_cable);
     IF (cable_test_input(cable_information(input_index).input_position) = on) THEN
       DO;
         temp = cable_information(output_index).input_position;
         cable_information(output_index).input_position =
             cable_information(input_index).input_position;
         cable_information(input_index).input_position = temp;
         input_index = number_of_positions_in_cable + 1;
       END;
     ELSE
       input_index = input_index + 1;
   END;
   IF (input_index = number_of_positions_in_cable) THEN
     cable_information(output_index).output_position = 11;
   CALL turn_off_all_outputs;
   CALL time(10);
END;

CALL set_output(turn_off_leds_1_to_8);
CALL set_output(turn_off_all_other_leds);

CALL write_current_cable_to_eeprom;

CALL set_output(turn_on_leds_1_to_8);
CALL set_output(turn_on_leds_9_and_10);

DO i = 0 TO 9;
   IF (cable_information(i).output_position = 11) THEN
     cable_information(i).output_position = 0;
END;

CALL run_cable_test;
```

```
END learn_cable;

/*--------------------------------------------------------------*/
$EJECT
/*--------------------------------------------------------------*/ light_show: PROCEDURE;

IF (time_delay_count <> 0) THEN
   time_delay_count = time_delay_count - 1;
ELSE
   DO;
      IF (light_show_count = 0) THEN
         DO;
            light_show_count = light_show_duration;
            CALL set_output(turn_off_leds_1_to_8);
            CALL set_output(turn_off_leds_9_and_10);
            IF (light_show_direction = up) THEN
               DO;
                  IF (light_show_position = 10) THEN
                     DO;
                        light_show_position = 9;
                        light_show_direction = down;
                     END;
                  ELSE
                     light_show_position = light_show_position + 1;
               END;
            ELSE
               DO;
                  IF (light_show_position = 1) THEN
                     DO;
                        light_show_position = 2;
                        light_show_direction = up;
                     END;
                  ELSE
                     light_show_position = light_show_position - 1;
               END;
            CALL turn_on_diagnostic_led(light_show_position);
         END;
      ELSE
         light_show_count = light_show_count - 1;
   END;

END light_show;

/*--------------------------------------------------------------*/
$EJECT
/*--------------------------------------------------------------*/

CALL init;

IF test_input_switch_made AND learn_input_switch_made THEN
   DO forever;
      DO i = 1 TO 10;
         IF (cable_test_input(i) = on) THEN
            CALL turn_on_diagnostic_led(i);
```

```
      ELSE
        CALL turn_off_diagnostic_led(i);
    END;
    IF test_input_switch_made THEN
      CALL set_output(turn_on_short_led);
    ELSE
      CALL set_output(turn_off_short_led);
    IF learn_input_switch_made THEN
      CALL set_output(turn_on_open_led);
    ELSE
    IF flip_input_switch_made THEN
      CALL set_output(turn_on_    _led);
    ELSE
      CALL set_output(turn_off_good_led);
  END;

DO forever;
    CALL time(5);
    IF test_input_switch_made THEN
      DO;
        CALL time(50);
        DO WHILE test_input_switch_made;
          CALL time(50);
        END;
        DO time_index = 1 TO 10;
          CALL time(100);
        END;
        CALL test_cable;
      END;
    ELSE IF learn_input_switch_made THEN
      DO;
        CALL time(50);
        DO WHILE learn_input_switch_made;
          CALL time(50);
        END;
        CALL learn_cable;
      END;
    ELSE IF (last_cable_good_flag = true) THEN
      CALL light_show;

END;

END modplug;
```

We claim:

1. In a cable making machine for making a cable assembly including a cable having conductors terminated to contacts of a first connector at one end and contacts of a second connector at the other end, testing means for testing electrical continuity between said contacts of said first and second connectors of said cable assembly, some of said contacts of said first connector having a one to one correspondence with a contact of said second connector, comprising:

(a) first and second sets of probes for making electrical contact with said contacts of said first and second connectors respectively;

(b) continuity means for testing electrical continuity between said probes of said first set and their corresponding probes of said second set; and (c) control means for causing said continuity means to selectively effect said testing in either a selected predetermined order of correspondence or a learned order of correspondence.

2. The testing means according to claim 1 including means for selecting some but not all of said probes and wherein said probes tested by said means for testing are only said selected probes.

3. The testing means according to claim 2 wherein said predetermined order of correspondence is defined by the 1st, 2nd, . . . , nth probes of said first set corresponding to the 1st, 2nd, . . . , nth probes of said second set.

4. The testing means according to claim 2 wherein said predetermined order of correspondence is defined by the 1st, 2nd, . . . , nth probes of said first set corresponding to the nth, (n−1)th, . . . , 1st probes of said second set.

5. The testing means according to claim 2 wherein said means for selecting includes an array of manually operable switches.

6. The testing means according to claim 1 including means for determining said order of correspondence of a frist cable assembly wherein said continuity means tests electrical continuity of subsequent cable assemblies in said determined order of correspondence.

7. In a cable making machine for making a cable assembly including a cable having conductors terminated to contacts of a first connector at one end and contacts of a second connector at the other end;

testing means for automatically, upon the making of said cable assembly, testing electrical continuity between said contacts of said first and second connectors of said cable assembly, some of said contacts of said first connector having a one to one correspondence with a contact of said second connector comprising:
   (a) first and second sets of probes for making electrical contact with said contacts of said first and second connectors respectively;
   (b) continuity means for testing electrical continuity between said probes of said first set and their corresponding probes of said second set; and
   (c) means for selecting only the probes of said first set which engage said some of said contacts of said first connector and the probes of said second set which engage the contacts of said second connector which correspond to said some of said contacts.

8. The testing means according to claim 7 wherein said means for selecting includes an array of manually operable switches, one different switch being associated with each different contact of said first connector.

9. In a method of making a cable assembly in a cable making and testing machine, said cable assembly including a cable having conductors terminated to contacts of a first connector at one end and contacts of a second connector at the other end; the steps comprising:
   (a) indicating the number of contacts in said connector;
   (b) indicating specifically which of said contacts are to be tested;
   (c) indicating the order of correspondence of the contacts to be tested of said frist connector to the contacts of said second connector;
   (d) performing a desired electrical test of said contacts to be tested of said first connector and their corresponding contacts of said second connector; and
   (e) displaying the results of said electrical test.

10. The method set forth in claim 9 wherein said indicating of steps (a) and (b) include manually setting electrical switches.

11. The method set forth in claim 9 wherein said indicating of step (c) includes the steps:
   (c1) placing a cable assembly of known confirmations into said cable making and testing machine; and
   (c2) determining the continuity paths for said contacts to be tested of said frist connector and their corresponding contacts of said second connector.

* * * * *

UNITED STATES PATENT AND TRADEMARK OFFICE
CERTIFICATE OF CORRECTION

PATENT NO. : 5,247,259
DATED : September 21, 1993
INVENTOR(S) : Matthew T. Miller et al.

It is certified that error appears in the above-identified patent and that said Letters Patent is hereby corrected as shown below:

Column 51 Claim 6, line 3, "frist" should be --first--.

Column 52 Claim 9, line 11, "frist" should be --first--.

Column 52 Claim 11, line 3, "confirmations" should be --configuration-- .; line 6, "frist" should be --first--.

Signed and Sealed this

Twenty-third Day of August, 1994

Attest:

BRUCE LEHMAN

Attesting Officer     Commissioner of Patents and Trademarks